United States Patent [19]
Constant

[11] 4,156,919
[45] May 29, 1979

[54] FEEDFORWARD FILTER

[76] Inventor: James N. Constant, 1603 Danbury Dr., Claremont, Calif. 91711

[21] Appl. No.: 848,571

[22] Filed: Nov. 4, 1977

[51] Int. Cl.² .............................................. G06F 7/38
[52] U.S. Cl. .................................................. 364/724
[58] Field of Search .......................... 364/724; 328/167

[56] References Cited

U.S. PATENT DOCUMENTS

| | | | |
|---|---|---|---|
| 3,619,586 | 11/1971 | Hoff, Jr. et al. ..................... | 364/724 |
| 3,659,229 | 4/1972 | Milton ................................. | 325/42 X |
| 3,703,632 | 11/1972 | Shanks ................................. | 364/724 |
| 3,979,684 | 9/1976 | Acker ................................... | 328/167 |
| 4,053,750 | 10/1977 | Constant .............................. | 364/724 |

OTHER PUBLICATIONS

Liv, "Effect of Finite Word Length on the Accuracy of Digital Filters—A Review" *IEEE Trans. on Circuit Theory* vol. CT-18 No. 6 Nov. 1971 pp. 670–677.

*Primary Examiner*—David H. Malzahn
*Attorney, Agent, or Firm*—Harris, Kern, Wallen & Tinsley

[57] ABSTRACT

In a feedforward filter (recursive or non-recursive) having input and output signals x and y and having impulse response h, apparatus and method for implementing the filter so that the errors accompanying the input signal x and errors normally associated with a filter are minimized.

23 Claims, 3 Drawing Figures

FEEDFORWARD FILTER

BACKGROUND OF THE INVENTION

The present invention relates to signal processing using matched filters, correlators, convolvers, Fourier analyzers, and particularly to low noise signal processors (filters) having input signal x and output signal y and using feedforward circuits for correcting input and filter errors. The signals x and y, for example, may be the transmitted and received signals in a radar, sonar, communications system, or the input and output of a general (recursive or non-recursive) filter.

My U.S. Pat. No. 4,053,750 discloses a feedforward filter in which the error normally associated with the filter is minimized. In my patent it was assumed that the input signal x was perfect, i.e., signal x had no error (noise), so that the error (noise) at the output of the filter was due exclusively to the error generated by the filter alone. Thus, the feedforward circuit of my patent is particularly effective when used to minimize the filter error when the noise which accompanies input x is of little concern. While the system of my patent will work when input signal is moderately noisy it can do so only up to a certain limit above which the noise increasingly captures the filter. To this extent, the feedforward filter of my patent is limited. The present invention seeks to remedy this situation by providing a feedforward filter which operates when both the input signal x is noisy and the filter itself is a noise source.

SUMMARY OF THE INVENTION

This invention provides apparatus and method for the implementation of feedforward filters capable of operating to minimize input and filter errors.

The general purpose of the invention is to provide new and improved feedforward filters. The term "feedforward" filter is used to indicate an analog or digital filter which employs the feedforward technique to minimize input and filter errors of a filter and is to be contrasted to the like term used in my patent which addressed primarily the filter error alone. Thus, while the feedforward filter of my patent minimizes the filter noise when the input noise is tolerable, the feedforward filter of the invention minimizes both the input and filter noise of a filter. Utilizing the system of the present invention the accuracy of a feedforward filter may be improved significantly over the prior art and is thereby for providing new and improved feedforward filters.

Briefly, the present invention provides an error-free efficient and economic feedforward filter. The design utilizes conventional components and is conventional up to a point; the distinguishing feature of the invention being the use of the feedforward technique for correcting both the input and filter errors of a filter. While the design of a prior art feedforward filter seeks to reduce the filter output error by reducing primarily the filter error alone, the invention feedforward filter seeks to reduce the output error by reducing both the input signal and filter errors.

In view of the foregoing description, the speed of operation, simplicity of construction, minimum power consumption and cost, and improved accuracy of a feedforward filter will become apparent. As a result, new and improved feedforward filters in accordance with the present invention may be produced which are fast, simple, accurate, and economically suited for use and mass consumption in a wide variety of applications, for example in the accurate determination of the frequency response and time delay of a system under test, in the unambiguous determination of closely spaced overlapping signals in a radar, sonar, communications system, and in the determination of the causality between two signals. Accordingly, the present invention may result in the significant speed of operation, accuracy, and decrease in the weight, size, power consumption, and costs of radars, sonars, communications systems, and test and measurement equipment.

These and other objects and advantages, the nature of the present invention, and its various features, will become more fully apparent upon consideration of the various illustrative embodiments now to be described in detail in connection with the accompanying drawings.

DESCRIPTION OF THE PREFERRED DRAWINGS

Figure 1:
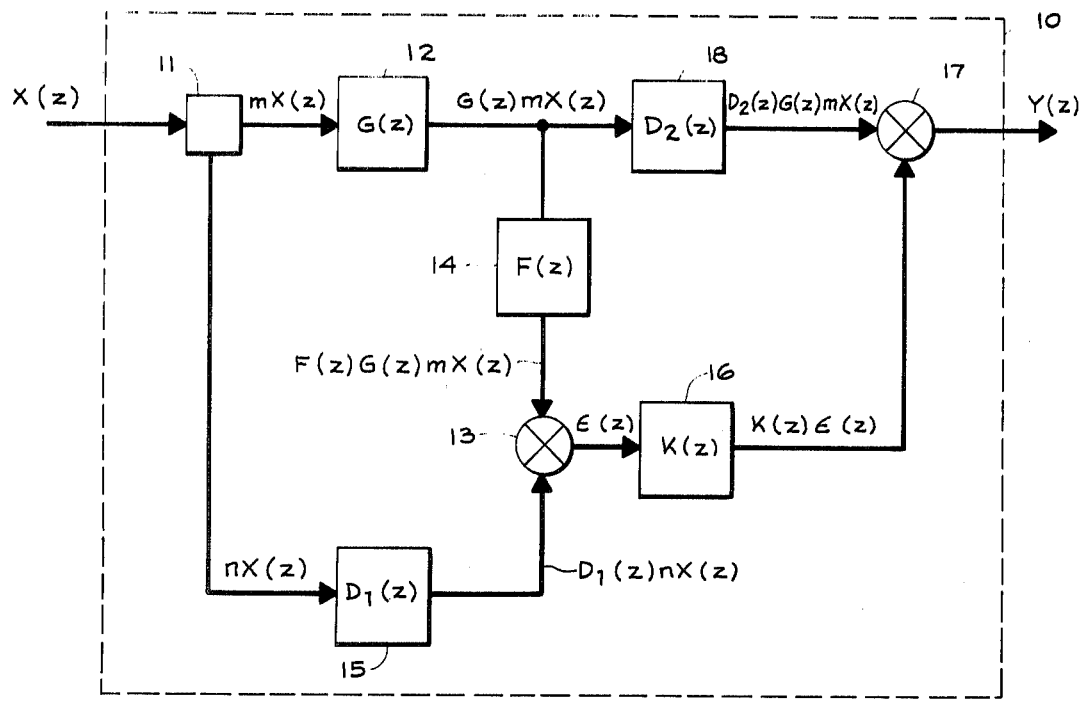
FIG. 1 is a block diagram of a feedforward filter of the prior art.

FIG. 1 is a block diagram of a feedforward filter 10 of the prior art. Signal $X(z)=F\{x\}$ is inputted to a signal divider 11 which divides signal $X(z)$ in two parts $mX(z)$ and $nX(z)$ where $m+n=1$. Signal $mX(z)$ is inputted to main filter 12 having transfer function $G(z)$ whose output $G(z)mX(z)$ goes to a first mixer, multiplier, adder or differencer 13 through second filter 14 having transfer function $F(z)$. Signal $nX(z)$ also goes to mixer 13 through first delay filter 15 having transfer function $D_1(z)$. The output signal $G(z)mX(z)$ of filter 12 contains the undesired filter error and is inputted to filter 14 whose output $F(z)G(z)mX(z)$ is then combined with the output signal $D_1(z)nX(z)$ from first delay filter 15 in mixer 13 to produce the error $\epsilon = F(z)G(z)mX(z) - D_1(z)nX(z)$ at the input to error filter 16 having transfer function $K(z)$. Error $\epsilon$ represents the error of filter 12 when input signal $X(z)$ is errorless. Signal $G(z)mX(z)$ from filter 12 goes to a second mixer 17 through second delay filter 18 having transfer function $D_2(z)$. Delay filters 15, 18 adjust the shape and delay of signals in their respective paths and are key to the successful implementation of feedforward filter 10. Finally, signal $D_2(z)G(z)mX(z)$ from delay filter 18 and signal $K(z)\epsilon$ from error filter 16 are combined in mixer, multiplier, adder or differencer 17 to obtain the output signal $Y(z)=H(z)X(z)=F\{y\}$ where $H(z)=F\{h\}$. In the foregoing the symbol $F\{\ \}$ denotes the Fourier transform of the quantity appearing within the brackets.

From the foregoing it will be appreciated that provided error signal $\epsilon$ represents the error at the output of filter 12 it can be subtracted from the output $G(z)mX(z)$ of filter 12 in a differencer 17 to obtain the errorless output $Y(z)$. This can be done clearly if delay filter 15 compensates for the delay and phase change of the signal path through filters 12 and 14 and if delay filter 18 compensates for the delay and phase change of the signal path through error filter 16. Significantly, the system of FIG. 1 works best when signal $X(z)$ is errorless (without noise). Moreover, it will be appreciated that while the filter 10 will operate with a moderate amount of noise at its input, it can do so only up to a certain limit beyond which the filter 10 is captured by the noise. It is this limitation of the prior art filter which the invention filter seeks to remedy.

Figure 2:
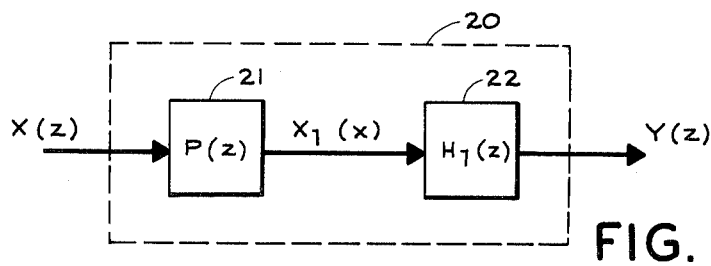
FIG. 2 is a block diagram of a first embodiment of a feedforward filter of the invention.

FIG. 2 is a block diagram of a first embodiment of a feedforward filter 20 of the invention. Signal X(z) is inputted to a prefilter 21 having transfer function P(z) and whose output $X_1(z)$ is then applied to a feedforward filter 22 having transfer function $H_1(z)$, for example the feedforward filters of FIGS. 1 and 3. In FIG. 2 it is to be understood that prefilter 21 has as its input a noisy signal X(z) and provides at its output a clean (noiseless) signal $X_1(z)$ which can then be processed by feedforward filter 22. Since $X_1(z)=P(z)X(z)$ it is clear that the output signal $Y(z)=H_1(z)P(z)X(z)$ so that the transfer function of filter 20 is $H(z)=H_1(z)P(z)$. Thus, the feedforward filter 20 differs from the prior art feedforward filter 10 through its incorporation of a prefilter 21 in combination with a (prior art or invention) feedforward filter 22. Clearly, the idea behind the system of FIG. 2 is to first clean up the noisy input signal X(z) before applying it to a feedforward filter to clean up the remaining errors. While this practice is quite common to the general filter art it has not been applied using a feedforward filter 22.

Prefilter 21 may operate in one of a number of possible modes; first as a noise filter which removes the input noise but leaves the signal unchanged, for example a noisy sine wave may be converted to a clean sine wave, or second as a matched filter which maximizes the output signal-to-noise ratio but changes the signal, for example a chirp signal would be converted to its correlation, or third a non-linear filter which removes the input noise but changes the signal, for example a hard limiter, and so forth. Also, prefilter 21 may be any one of a number of types depending whether the noise is Gaussian, white, broadband, narrowband, constant amplitude, constant frequency, constant phase, multipath signals, etc. Thus, prefilter 21 may include any one of a number of well known noise cancellers, noise silencers, limiters, receivers providing constant false alarm, thresholds, automatic gain control, logarithmic response, forward biasing, fast time constant, sensitivity time control, interference suppression, synchronization and blanking, post-detection integration, etc., these units all being well known in the radar and communications arts, for example as suggested in the book by M. Skolnik "Introduction to Radar Systems" McGraw-Hill 1962 particularly in chapters 9 and 12. It will be obvious therefore to construct prefilter 21 in a given application.

Figure 3:
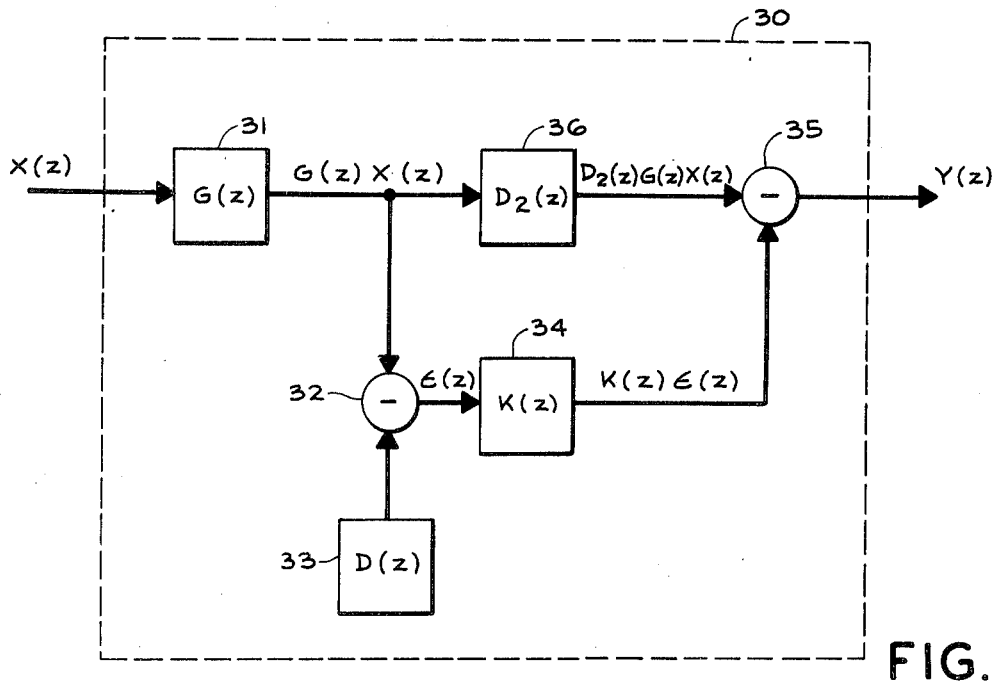
FIG. 3 is a block diagram of a second embodiment of a feedforward filter of the invention.

FIG. 3 is a block diagram of a second embodiment of a feedforward filter 30 of the invention. Signal X(z) is inputted to a first filter 31 having transfer function G(z) whose output G(z)X(z) goes to a first mixer, multiplier, adder or differencer 32. Means 33 are provided for generating a signal D(z) which represents the desired, i.e., ideal or noiseless, form of signal G(z)X(z). Signals G(z)X(z) and D(z) are applied to mixer 32 shown as a differencer by way of example and the error $\epsilon = G(z)X(z) - D(z)$ is developed at the output of mixer 32 which is then applied to error filter 34 having transfer function K(z). Error $\epsilon$ represents the error in signal G(z)X(z) due to the combined errors of input signal X(z) and the filter 31 transfer function G(z). Signal G(z)X(z) goes to a second mixer 35 through delay filter 36 having transfer function $D_2(z)$. Delay filter 36 adjusts the shape and delay of signals in its path and is key to the successful implementation of feedforward filter 30. Finally, signal $D_2(z)G(z)X(z)$ from delay filter 36 and signal K(z) $\epsilon$ from error filter 34 are combined in unit 35 to obtain the output signal $Y(z)=H(z)Z(z)=F\{y\}$ where $H(z)=F\{h\}$ is the transfer function of feedforward filter 30. The unit 15 may be a mixer, multiplier, adder or differencer.

From the foregoing it will be appreciated that provided error signal $\epsilon$ represents the error at the output of filter 31 it can be subtracted from signal G(z)X(z) in mixer 35 to obtain the errorless output signal Y(z). This can be done clearly if delay filter 36 compensates for the delay and phase of the signal path through error filter 34. Significantly, the system of FIG. 3 works best when signal X(z) is noisy as well as when filter 31 is noisy. Moreover, it will be appreciated that feedforward filter 30 will operate with noise at its input and with filter 31 noise, both noise sources being compensated or minimized by feedforward filter 30. Thus, the feedforward filter 30 differs from the prior art feedforward filter 10 by its apparatus and method to minimize both the input and filter noise errors versus the latters apparatus and method to minimize primarily the filter noise. Clearly, the idea behind the system of FIG. 3 is to provide the desired response D(z) of filter 31 in advance. While this may not always be possible in practice it will be the case for many applications.

Let noisy signals X(z), G(z) have noiseless components Z(z), H(z) and errors $\epsilon_1$, $\epsilon_2$ respectively, i.e., $X(z)=Z(z)+\epsilon_1(z)$ and $G(z)=H(z)+\epsilon_2(z)$. Thus, feedforward filter 30 provides a noiseless output $Y(z)=H(z)Z(z)$ compared to filter 31 which provides the noisy output G(z)X(z). It is this capability of the former over the latter filters to provide error free results. It is a well known fact in the filtering art that both recursive and non-recursive filters, for example analog or digital filter 31, generate internal noise. While this filter noise can be reduced to a certain extent by using well known design and noise suppression techniques inside filter 31 a certain amount of noise will persist and this limits the more advanced filtering applications. Moreover, the noise which accompanies input signal X(z) will always degrade a filter's performance especially at the lower signal-to-noise input ratios where the noise competes more effectively to capture the filter from the signal. Both such noise components are minimized by filter 30 by the combining of filter 31 with added elements 32–36 in a feedforward circuit. For example, if signals G(z)X(z) and D(z) are actual and ideal convolutions in a filter 31 then the system of FIG. 3 can be used to develop the error $\epsilon = G(z)X(z) - D(z)$ of the convolution and next to subtract error $\epsilon$ from the actual convolution G(z)X(z) in a differencer 35 to obtain the ideal convolution $Y(z)=D_2(z)G(z)X(z)-K(z)[G(z)X(z)-D(z)]$ which for $K(z)=D_2(z)$ becomes $Y(z)=D_2(z)D(z)$. Now if filters 34 and 36 are specified to be amplifiers, i.e., $K(z)=K$ and $D_2(z)=D_2$, then the output is, except for the constant $D_2$, $Y(z)=D(z)$. Thus, output Y(z) appears only if the signal Z(z) is present.

When comparing the invention filters of FIGS. 2 and 3, the advantage of the FIG. 2 system is that it does not require a priori knowledge of the means 33 for generating the ideal filter function D(z), as is the case for the system of FIG. 3. In either case however, it is the lack of any limitation by the input noise which accompanies signal X(z) wherein the invention filters 20 and 30 differ from the prior art feedforward filter 10. It will be appreciated therefore that the invention implements a feedforward filter which minimizes a filter's dependence upon the input noise as well as the internal filter noise.

The invention therefore offers added benefits of filtering signals over the prior art.

In many applications it is desirable to reduce the errors in a filter. Such applications may require operations which include matched clutter filtering for echo ranging, or for coherent communications systems, convolution to obtain high resolution between signals and recursive filtering, i.e., filters having zeros and poles, for general transformations on data vectors. The feedforward filter of the invention performs such signal filtering tasks in excess of the capabilities of the prior art filters. Its applications include and are well suited for the detection, resolution and identification of signals and the determination of signal causality. Options for the implementation of filters are limited by input errors and errors normally associated with a filter. The present invention offers outstanding practical implementations of minimizing such errors in filters and should find use in such sophisticated signal processing tasks as system identification, signal identification, bit synchronization, bit detection, error correction, coding, pulse compression, geological, earthquake and astronomical signal analysis, medical signal analysis, and in such divers systems as radar, sonar, communications systems, industrial control systems, electronic and medical test equipment and so forth. In particular, the present invention provides fast, accurate, efficient, and economic means for removing input and internal errors in complex filters and thereby extending the speed, efficiency, accuracy and economic availability of such devices. As a consequence, the system of the present invention is expected to make dramatic increases in the speed and accuracy of such devices and corresponding reductions in the complexity and cost of accurately detecting and identifying signals, i.e., in the speedup of operation, increasing of the accuracy, and lowering of the weight, size, power consumption and costs of radars, sonars, communications systems, industrial controls, test equipment and so forth.

Although a feedforward filter has been described it should be understood that the scope of the invention should not be considered to be limited by the particular embodiment of the invention shown by way of illustration but rather by the appendant claims.

I claim:

1. A feedforward filter having a transfer function $H(z)$, and comprising in combination:
    a first filter having an arbitrary transfer function $G(z)$,
    said first filter having as input an arbitrary signal $X(z)$ and providing an output signal $G(z)X(z)$;
    first means for providing an output signal $D(z)$;
    second means having as inputs the output signal $G(z)X(z)$ from said first filter and the output signal $D(z)$ from said first means, and providing as an output the error signal $\epsilon(z)$ representing the error between signals $G(z)X(z)$ and $D(z)$;
    a second filter having the transfer function $K(z)$,
    said second filter having as input the error $\epsilon(z)$ from said second means and providing as an output the signal $K(z)\epsilon(z)$;
    a third filter having the transfer function $D_2(z)$,
    said third filter having as input the signal $G(z)X(z)$ from said first filter and providing as an output the signal $D_2(z)G(z)X(z)$; and
    third means having as inputs the signal $D_2(z)G(z)X(z)$ from said third filter and the signal $K(z)\epsilon(z)$ from said second filter and providing as an output the signal $Y(z)=H(z)Z(z)$,
    where $H(z)$ is the errorless filter function corresponding to the actual filter function $G(z)$,
    $Z(z)$ is the errorless signal function corresponding to the actual signal function $X(z)$, and
    $D(z)$ is the errorless signal function corresponding to the actual signal function $G(z)X(z)$.

2. The system of claim 1 wherein said signal $D(z)$ is the desired form of said signal $G(z)X(z)$.

3. The system of claim 1 wherein said transfer function $H(z)$ is the desired form of said arbitrary transfer function $G(z)$.

4. The system of claim 1 wherein said signal $Z(z)$ is the desired form of said arbitrary signal $X(z)$.

5. The system of claim 1 wherein at least one of said second and third means is a differencer.

6. The system of claim 1 wherein said transfer functions are characterized by $K(z)=D_2(z)$.

7. The system of claim 1 wherein said transfer functions are characterized by $K(z)=G(z)$.

8. The system of claim 1 wherein at least one of said first, second, and third filters is an amplifier.

9. The system of claim 1 wherein one or more of said first, second, and third filters is a feedforward filter.

10. The system of claim 1 wherein said first filter is a recursive filter.

11. The system of claim 1 wherein said first filter is a non-recursive filter.

12. The system of claim 1 wherein at least one of said first, second, and third filters and means is an analog device.

13. The system of claim 1 wherein at least one of said first, second, and third filters and means is a digital device.

14. A method of feedforward filtering with a transfer function $H(z)$, including the steps of:
    (1) inputting arbitrary signal $X(z)$ into a first filter having arbitrary transfer function $G(z)$;
    (2) providing signal $G(z)X(z)$ at the output of said first filter;
    (3) providing signal $D(z)$ at the output of a first means;
    (4) inputting signal $G(z)X(z)$ from said first filter and signal $D(z)$ from said first means to a second means;
    (5) providing signal $\epsilon(z)$ representing the error of said signals $G(z)X(z)$ and $D(z)$ at the output of said second means;
    (6) inputting error signal $\epsilon(z)$ from said second means to a second filter having transfer function $K(z)$;
    (7) providing signal $K(z)\epsilon(z)$ at the output of said second filter;
    (8) inputting signal $G(z)X(z)$ from said first filter to a third filter having transfer function $D_2(z)$;
    (9) providing signal $D_2(z)G(z)X(z)$ at the output of said third filter;
    (10) inputting signal $D_2(z)G(z)X(z)$ from said third filter and signal $K(z)\epsilon(z)$ from said second filter to a third means; and
    (11) providing signal $Y(z)=H(z)Z(z)$ at the output of said third means,
    where $H(z)$ is the errorless filter function corresponding to the actual filter function $G(z)$,
    $Z(z)$ is the errorless signal function corresponding to the actual signal function $X(z)$, and
    $D(z)$ is the errorless signal function corresponding to the actual signal function $G(z)X(z)$.

15. The method of claim 14 wherein at least one of steps (5) and (11) includes determining signals $\epsilon(z)$ and $Y(z)$ as a difference between signals in steps (4) and (10).

16. The method of claim 14 wherein step (6) includes providing $K(z) = G(z)$.

17. The method of claim 14 wherein step (6) includes providing $K(z) = D_2(z)$.

18. The method of claim 14 wherein at least one of steps (2), (7) and (9) includes amplification.

19. The method of claim 14 wherein at least one of steps (2), (7) and (9) includes feedforward filtering.

20. The method of claim 14 wherein at least one of steps (2), (7) and (9) includes recursive filtering.

21. The method of claim 14 wherein at least one of steps (2), (7) and (9) includes non-recursive filtering.

22. The method of claim 14 wherein at least one of steps (1)–(11) is an analog operation.

23. The method of claim 14 wherein at least one of steps (1)–(11) is a digital operation.

* * * * *